United States Patent [19]

Yamauchi

[11] Patent Number: 4,719,450

[45] Date of Patent: Jan. 12, 1988

[54] METHOD AND SYSTEM FOR BINARY-TO-DECIMAL INTERCONVERSION

[75] Inventor: Shingo Yamauchi, Tokyo, Japan

[73] Assignee: Sony Corporation, Tokyo, Japan

[21] Appl. No.: 827,616

[22] Filed: Feb. 10, 1986

[30] Foreign Application Priority Data

Feb. 16, 1985 [JP] Japan .................................. 60-29885

[51] Int. Cl.$^4$ .............................................. H03M 7/00
[52] U.S. Cl. .............................................. 340/347 DD
[58] Field of Search .............................. 235/310, 311; 340/347 DD

[56] References Cited

U.S. PATENT DOCUMENTS 3,636,329  1/1972  De Sipio ............................ 235/311

Primary Examiner—Charles D. Miller
Attorney, Agent, or Firm—Ronald P. Kananen

[57] ABSTRACT

A process for performing binary-to-decimal conversion distinguishes between two major subdivisions of the information represented by the binary values and signifies the type of information for each value by a so-called attribute bit. The attribute bits for several binary values can be encoded into a single decimal digit while each binary value is itself converted to a reduced number of decimal digits.

12 Claims, 8 Drawing Figures

METHOD AND SYSTEM FOR BINARY-TO-DECIMAL INTERCONVERSION

BACKGROUND OF THE INVENTION

1. Field of the Invention

The present invention relates generally to a method and system for binary-to-decimal conversion and vice versa. More specifically, the invention relates to a method and a system for converting between binary and decimal notations, and in particular, between 8-bit hexadecimal and decimal notations. The invention further relates to a method and system for binary-to-decimal conversion of data transmission codes representative of alphanumerical characters and the like into decimal digit sequences.

2. Description of the Prior Art

Binary codes, most often hexadecimal codes, are commonly used to represent alphanumeric characters and the like. In order to duplicate these hexadecimal codes in bar code using the two-out-of-five decimal notation system, the hexadecimal codes must first be converted to decimal notation.

Conventional binary-to-decimal conversion systems simply convert each 4-bit nibble of an 8-bit code from hexadecimal to decimal. For example, in JIS 8-bite codes, the Japanese katakana character (ァ) is represented by hexadecimal code (DC)H, which would be converted into the sequence of decimal digits (220). Such decimal digit sequences are then converted into two-out-of-five bar-code, in which 2 lines from among 4 lines are thickened to represent "1" bits.

The JIS and ASCII 8-bit codes provide 256 combinations, each representing a specific character or command. But, among these combinations, the ranges (00)H to (1F)H and (80)H to (9F)H are used as control codes for controlling the operation of printers and other external devices. Therefore, these cannot be used to represent alphanumeric characters or the like.

On the other hand, when bar codes are used to label retail products such as video tape cassettes (VTR cassette), the aforementioned codes specifically reserved as control codes cannot be used. Therefore, when using bar codes for such purposes, it is not necessary to convert these control codes.

Therefore, the present invention is intended to provide a method and system for performing binary-to-decimal conversion which ignores the aforementioned control codes and thus performs conversion more efficiently. Furthermore, the invention is intended to provide a method and a system for binary-to-decimal conversion in which a major attribute of each 8-bit value is encoded in a decimal digit which also represents the attributes of two other 8-bit values. This helps make the binary-to-decimal conversion even more efficient.

SUMMARY OF THE INVENTION

Therefore, it is an object of the present invention to provide a method and a system for efficiently performing binary-to-decimal interconversion.

Another object of the present invention is to provide a method and system for converting hexadecimal code into decimal digits, which requires less memory area to store the converted decimal digits.

More specifically, the invention relates to a method and system, which avoids conversion of control codes and converts binary codes into a compressed decimal digit format.

In order to accomplish the aforementioned and other objects, a process for performing binary-to-decimal conversion distinguishes between two major subdivisions of the information represented by the binary values and signifies the type of information for each value by a so-called attribute bit. The attribute bits for several binary values can be encoded into a single decimal digit while each binary value is itself converted to a reduced number of decimal digits.

In the preferred process, the binary code to be binary-to-decimal converted is compressed during conversion for more efficient transmission.

A binary-to-decimal conversion system according to the invention breaks each binary value down into an encoded value representing either of two specific pieces of information and an attribute bit specifying which piece of information is represented. The conversion system then converts the encoded values for three binary values in decimal digits and the three corresponding attribute bits into a single decimal digit for application in a two-out-of-five notation bar-code system. According to the present invention, since fewer decimal digits are needed to represent a given number of binary values, the number of the decimal digits in the bar code can be reduced.

According to one aspect of the invention, a binary code processor for processing binary codes which represent at least first and second types of information in different ranges of value, comprises memory means for storing the binary codes, means for generating an identification code indicating to which of the first and second types of information each binary code in the memory means belongs, means for compressing the range of value of the binary code in accordance with the identification code, means for converting the compressed binary code and the identification code to decimal binary codes in accordance with the identification code, and storing means for storing the decimal binary codes.

In the preferred embodiment, the binary code is a hexadecimal code. The identification code generating means includes a comparator for comparing the hexadecimal code with a predetermined value. The comparator produces a single binary bit.

The compressing means includes a subtractor for subtracting a predetermined value from the hexadecimal code.

According to another aspect of the invention, a method of converting a plurality of 8-bit JIS or ASCII values into a corresponding sequence of decimal digits, comprises: generating for each 8-bit value an attribute bit indicating whether the value is greater than a first given value, truncating the most-significant bit of every 8-bit value, subtracting a second given value from each resulting 7-bit value, converting the resulting value for each original 8-bit value into a pair of decimal digits, concatenating the attribute bits for no more than three 8-bit values into a 3-bit attribute value, converting the 3-bit attribute value into a decimal attribute digit, and concatenating the attribute digit and the decimal digits for the three corresponding 8-bit values.

A method of converting a string of decimal digits, produced by the aforementioned binary-to-decimal conversion method back into binary JIS or ASCII format, comprises: converting the attribute digit into three attribute bits, each corresponding to one pair of decimal digits, converting pairs of decimal digits into binary values, adding (20)H to the binary values, and adding (80)H to each binary value of which the corresponding attribute bit indicates that the original 8-bit value was greater than (80)H.

BRIEF DESCRIPTION OF THE DRAWINGS

The present invention will be understood from the detailed description given herebelow and from the accompanying drawings of the preferred embodiment of the invention, which, however, should not be taken to limit the invention to the specific embodiment, but are for explanation and understanding only.

In the drawings.

DESCRIPTION OF THE PREFERRED EMBODIMENTS

Figure 1:
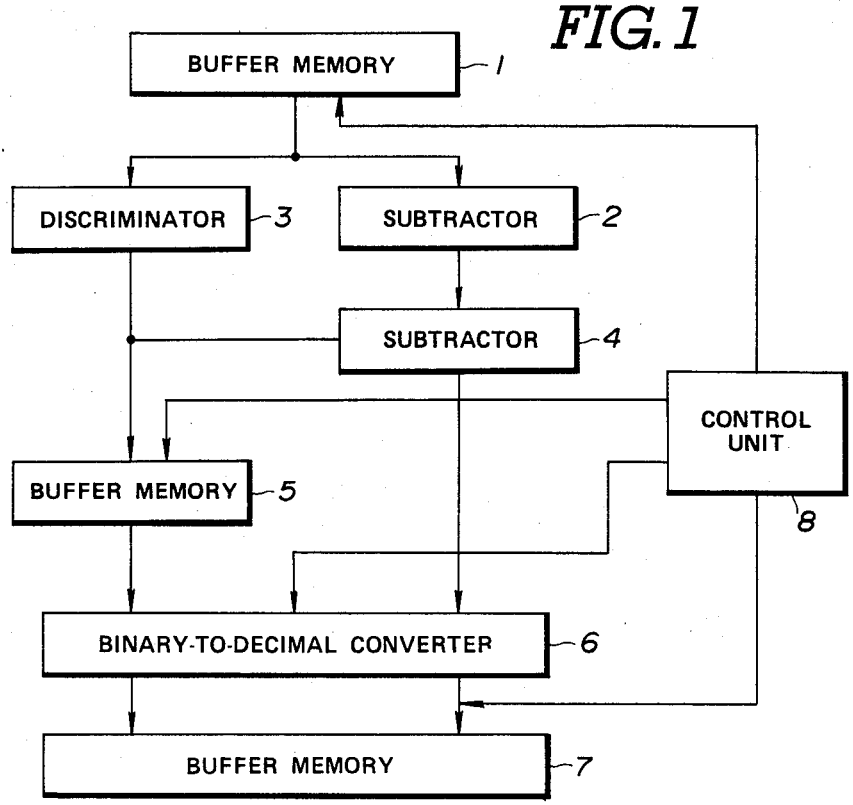
FIG. 1 is a schematic block diagram of the preferred embodiment of a binary-to-decimal conversion system according to the invention.

Referring now to the drawings, particularly to FIG. 1, the preferred embodiment of a binary-to-decimal conversion system, according to the invention, converts JIS 8-bit codes into a decimal digit sequence. The conversion system includes a buffer memory 1 which stores a plurality of binary codes to be converted to decimal. The buffer memory 1 avoids binary codes serving as a control code, since such control codes need not be converted. The stored binary codes are read out one-by-one under the control of a control unit 8 and fed to a subtractor 2 and a discriminator 3.

The subtractor 2 subtracts (20)H from the value of the read binary code. The output of the subtractor is transmitted to a second subtractor 4.

The discriminator 3 distinguishes between binary codes that represent alphanumerical characters and those that represent Japanese katakana characters. For this purpose, the discriminator 3 compares the value of the input binary code with (80)H. If the input binary code is representative of a Japanese katakana character, and thus its value is equal to or greater than (80)H, the output value of the discriminator 3 goes to "1". On the other hand, if the binary code is representative of an alphanumeric character, and thus the value of the binary code is less than (80)H, the output value of the discriminator 3 goes to "0". The output of the discriminator 3 is sent to the subtractor 4 and a buffer memory 5.

The subtractor 4 is responsive to a discriminator output of "1" to subtract (80)H from the data value of the input from the subtractor 2. Otherwise, the subtractor 4 has no effect on the input data from the subtractor 2. As a result of this operation, corresponding Japanese katakana characters and alphanumeric characters are represented by the same binary code.

The buffer memory 5 is controlled by the control unit 8 and accumulates discriminator outputs by shifting data in the order received. The data stored in the buffer memory 5 serves as attributes of the binary codes to be converted indicative of the kind of character, i.e. Japanese katakana or alphanumeric, represented by the corresponding binary codes. After reading out all of the stored binary codes from the buffer memory 1, the accumulated data in the buffer memory 5 are transferred to a binary-to-decimal converter 6. The data from the buffer memory 5 is converted to binary coded decimal (BCD) code by the binary-to-decimal converter 6 and stored in the buffer memory 7 in the order received as attribute codes. Similarly, the outputs of the subtractor 4 are fed to the binary-to-decimal converter 6 and converted into BCD code. The BCD codes derived from the outputs of the subtractor 4 are also accumulated in the buffer memory 7 with the attribute codes in a specified order under the control of the control unit 8.

The aforementioned preferred embodiment of the binary-to-decimal conversion system can be composed of digital circuit elements. It would also be possible to perform this binary-to-decimal conversion by means of a microprocessor programmed to perform the various functions set forth above.

In order to facilitate a better understanding of the binary-to-decimal conversion performed by the preferred embodiment of the conversion system of FIG. 1, practical conversion will be described herebelow with reference to FIGS. 2A to 2C, in which the letter "M": (4D)H and the Japanese katakana characters "ヘ": (CD)H and "기": (B6)H are converted into respective decimal digit sequences.

Figure 2A:
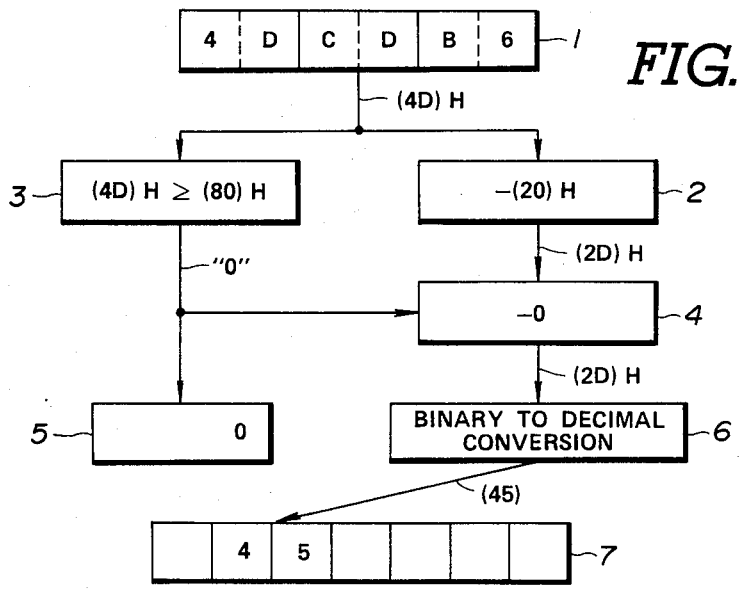
FIGS. 2A to 2C are explanatory diagrams of the operation of the conversion system of FIG. 1.

FIG. 2A illustrates the process of binary-to-decimal conversion of (4D)H representing the letter "M". The binary code of (4D)H is read from the buffer memory 1 and sent to the subtractor 2 and the discriminator 3. In the subtractor 2, the value (20)H is subtracted from the value (4D)H. Therefore, the output of the subtractor 2 becomes (2D)H.

On the other hand, in accordance with the fact that the character represented by the binary code (4D)H is alphabetical, the data value (4D)H is smaller than (80)H. Therefore, the output value of the discriminator 3 is "0". The subtractor 4 thus does not perform its subtracting operation, but rather transmits the value (2D)H to the binary-to-decimal converter 6 directly. The binary-to-decimal converter 6 converts the binary code (2D)H from the subtractor 4 into the BCD code (45). The BCD code (45) derived by the binary-to-decimal converter 6 is stored in the buffer memory 7, leaving open a 4-bit slot which will be explained later.

At the same time, the output "0" of the discriminator 3 is fed to the buffer memory 5 and stored therein.

Figure 2B:
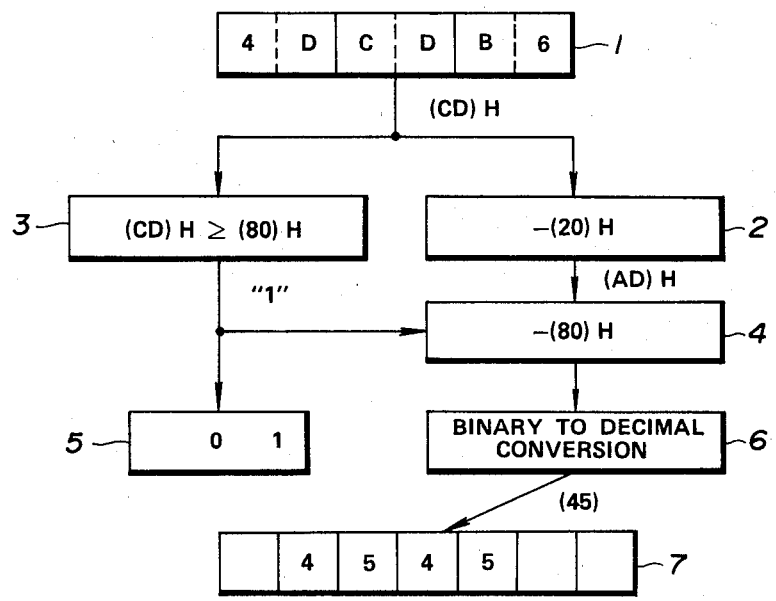

FIG. 2B shows the conversion process for the binary code of (CD)H which is representative of the Japanese katakana character "ヘ". As above, the value (CD)H is read from the buffer memory 1 and fed to the subtractor 2 and the discriminator 3. The subtractor 2 subtracts the value (20)H from the value (CD)H. In this case, the result of the subtraction will be (AD)H.

At the same time, the discriminator 3 compares the value (CD)H with the value (80)H. In keeping with the fact that the binary code (CD)H is representative a the Japanese katakana character, the data value (CD)H is greater than (80)H. Therefore, the output of the discriminator 3 will be "1". This discriminator output "1" triggers the subtractor 4 to subtract (80)H from the output (AD)H of the subtractor 2. As a result, the subtractor 4 outputs the value (2D)H to the binary-to-decimal converter 6. The binary-to-decimal converter 6 then performs binary-to-decimal conversion to derive the corresponding BCD code. In case of the data value (2D)H, the derived BCD code will be (45).

The output "1" of the discriminator 3 is also stored in the buffer memory 5.

Figure 2C:
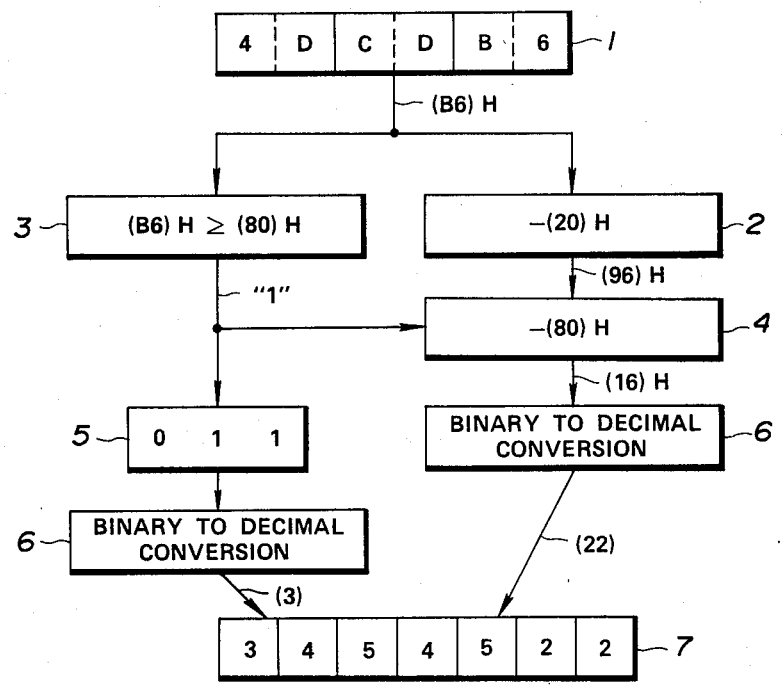

FIG. 2C illustrates the process of binary-to-decimal conversion of the binary code (B6)H which is representative of the Japanese katakana character " ⁀ ". As in the above conversion process, the value (20)H is subtracted from the value (B6)H, resulting in the value (96)H. In this case, the value (B6)H is greater than the value (80)H, and thus the discriminator output will be "1". The subtractor 4 responds to the "1" discriminator output by subtracting (80)H from the output (96)H of the subtractor 2 and outputting the resulting value (16)H to the binary-to-decimal converter 6. The binary-to-decimal converter 6 converts the binary code value (16)H into BCD code value (22). The resultant BCD code (22) is sent to the buffer memory 7 and stored therein.

At the same time, the discriminator output "1" is fed to the buffer memory 5 and accumulated therein. Since, at this time, the binary codes for three characters have all been converted into BCD code, the control unit 6 outputs a command for copying the accumulated value in the buffer memory 5 to the binary-to-decimal converter 6. In this case, the accumulated value is (011), when which converted to BCD code has the value (3). Therefore, this converted BCD code (3) is fed to the buffer memory 7 and stored in the slot previously allocated therefor.

Each of the decimal digits thus converted from binary will be further converted into a special 5-bit code and then into the two-out-of-five system bar code, when the preferred embodiment of the code conversion system is applied to a bar-code encoding system.

Figure 3:
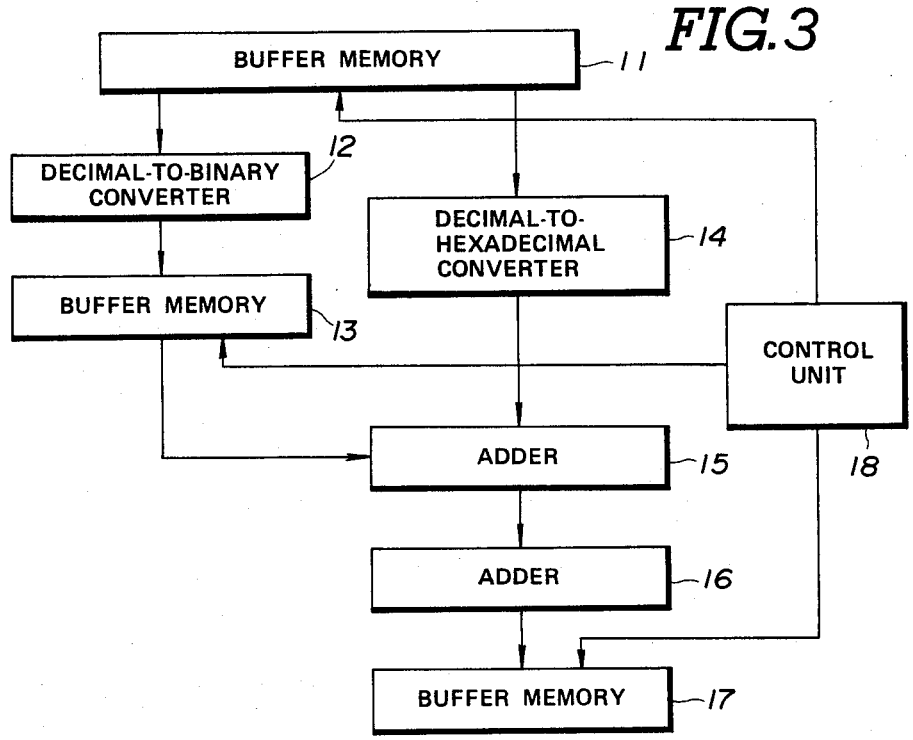
FIG. 3 is a block diagram of a decimal-to-binary conversion system serving as back-conversion system to the conversion system of FIG. 1.

FIG. 3 shows the preferred embodiment of a decimal-to-binary conversion system according to the invention which may be used to convert the decimal digit sequence produced by the binary-to-decimal conversion system of FIG. 1 back into binary notation.

In FIG. 3, the decimal-to-binary conversion system includes a buffer memory 11 for storing a decimal digit sequence wherein out of every seven digits, the first holds attribute information. When this conversion system is used for decimal-to-binary conversion of two-out-of-five notation system bar-codes, the buffer memory 11 stores the decimal digit sequence decoded from the bar codes.

The buffer memory 11 is connected to a decimal-to-binary converter 12 and a decimal-to-hexadecimal converter 14. The decimal-to-binary converter 12 receives the decimal attribute digit from the buffer memory 11 and converts the decimal attribute digit into binary code. The binary attribute code derived by the decimal-to-binary converter 12 is saved in a buffer memory 13.

The remaining decimal digits of each group of 7 digits are fed to the decimal-to-hexadecimal converter 14 in 2-digit groups. The output of the decimal-to-hexadecimal converter 14, representative of the resultant hexadecimal value, is fed to an adder 15.

The adder 15 receives the corresponding attribute bit from the buffer memory 13 and adds (80)H whenever the corresponding attribute bit is "1" and otherwise does not perform the addition. The output of the adder 15 is fed to another adder 16. The adder 16 adds the value (20)H to the value from the adder 15. The output of the adder 16 is written into a buffer memory 17 at a timing controlled by a control unit 18.

As in the above binary-to-decimal conversion system, the preferred embodiment of the decimal-to-binary conversion system can be implemented with a combination of the digital circuit elements. The conversion system can also be implemented by a microprocessor so programmed as to performed the process set forth above.

In order to facilitate a better understanding about the decimal-to-binary conversion performed by the conversion system of FIG. 3, the practical process of converting a decimal digit sequence into binary codes will be described herebelow with reference to FIGS. 4A and 4C. The example given herebelow illustrates the process of converting the decimal digit (3454522) into JIS 8-bit values.

Figure 4A:
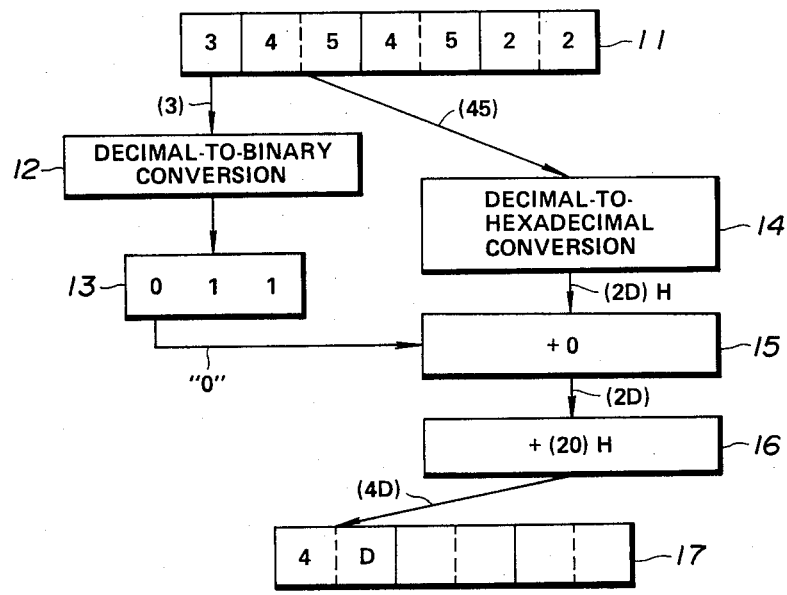
FIGS. 4A to 4C are explanatory block diagrams of examples of back-conversion performed by the decimal-to-binary conversion system of FIG. 3.

In FIG. 4(A), first the attribute data (3) and the first two digits (45) of the decimal digit sequence are converted. The attribute data (3) is read out from the buffer memory 11 and transmitted to the decimal-to-binary converter 12. The decimal-to-binary converter 12 converts the decimal value (3) into the 3-bit binary value (011). The converted binary value (011) is fed to the buffer memory 13 to be stored therein.

The next two decimal digits (45) are read from the buffer memory 11 and sent to the decimal-to-hexadecimal converter 14. The decimal-to-hexadecimal converter generates an 8-bit code (2D)H corresponding to the decimal value (45). The output of the decimal-to-hexadecimal converter 14 is sent to the adder 15. At this time, the control unit 18 orders the first attribute bit to be output by the buffer memory 13. As set forth above, since the first bit of the buffer memory is "0", which means that the character identified by the 8-bit code (2D)H is a letter, the adder 15 does nothing and simply passes the output of the decimal-to-hexadecimal converter 14 to the adder 16. The adder 16 adds (20)H to the output (2D)H of the decimal-to-hexadecimal converter 14 and thus outputs the 8-bit code (4D)H which identifies the letter "M". The converted 8 bit code (4D)H is stored in the buffer memory 17.

Figure 4B:
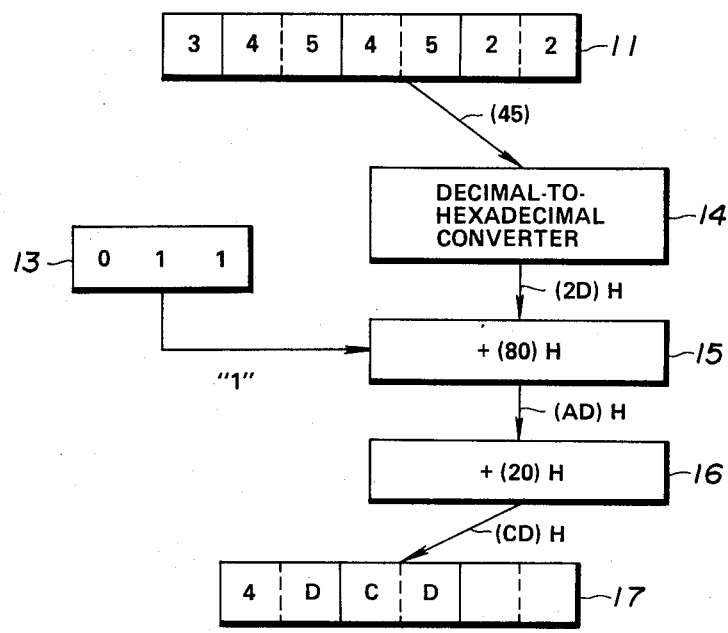

Next, as shown in FIG. 4(B), the next two digits (45) of the decimal digit sequence are converted. Therefore, the decimal number sequence (45) is read out from the buffer memory 11 and fed to the decimal-to-hexadecimal converter 14. The decimal-to-hexadecimal converter generates the 8-bit code (2D)H corresponding to the decimal value (45). The output of the decimal-to-hexadecimal converter 14 is sent to the adder 15. In this case, the second attribute bit is "1", which means that the character identified by the 8 bit code (2D)H is a katakana character, so the adder 15 adds (80)H to the output value (2D)H from the decimal-to-hexadecimal converter and sends the result (AD)H to the adder 16. The adder 16 adds (20)H to the output (AD)H of the decimal-to-hexadecimal converter 14 and thus output the 8-bit code (CD)H which identifies the Japanese katakana character "⁀". The converted 8-bit code (CD)H is stored in the buffer memory 17.

Figure 4C:
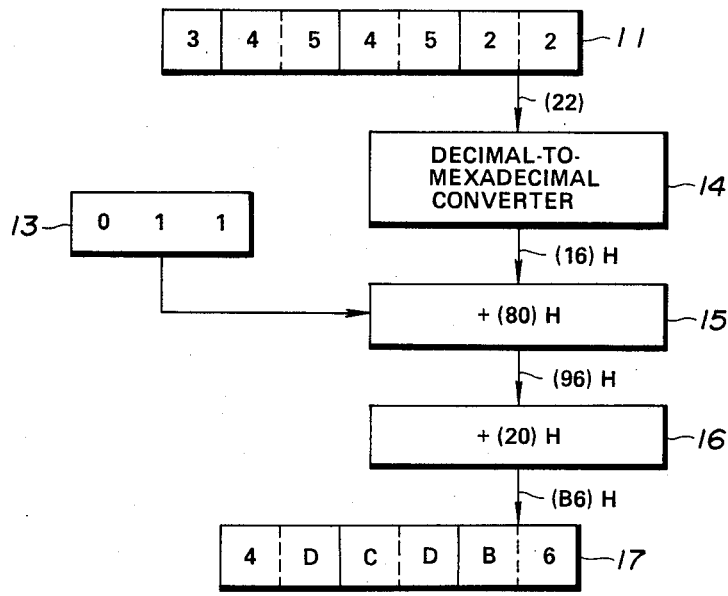

Finally, as shown in FIG. 4(C), the last two digits (22) of the seven digit sequence are converted. Therefore, the decimal digits (22) are read from the buffer memory 11 and sent to the decimal-to-hexadecimal converter 14. The decimal-to-hexadecimal converter generates the 8-bit code (16)H corresponding to the decimal value (22). The output of the decimal-to-hexadecimal converter 14 is fed to the adder 15. Since the third bit of the buffer memory is "1", which means that the character identified by the 8-bit code (16)H is a katakana character, the adder 15 adds (80)H to the output value (16)H from the decimal-to-hexadecimal converter and sends the result (96)H to the adder 16. The adder 16 adds (20)H to the output (96)H of the decimal-to-hexadecimal converter 14 and thus outputs the 8-bit code (B6)H which identifies the Japanese katakana character "ハ". The converted 8-bit code (B6)H is stored in the buffer memory 17.

Therefore, upon completing a conversion of all seven digits of the decimal digit sequence stored in the buffer memory, the JIS 8-bit codes (4D)H, (CD)H and (B6)H respectively identifying the letter "M" and the Japanese katakana characters "ヽ" and "ハ" are stored in the buffer memory 17.

As will be appreciated herefrom, the present invention makes it possible to reduce the number of decimal digits required to represent JIS or ASCII 8-bit codes. The effect of the present invention will become more clear from the following table.

| Number of Chara. (JIS 8 bit Codes) | Attribute Digits | Invention (Digits per byte) | Prior Art |
|---|---|---|---|
| 1 | 1 | 3 (3) | 3 |
| 2 | 1 | 5 (2.5) | 6 |
| 3 | 1 | 7 (2.33) | 9 |
| 4 | 2 | 10 (2.5) | 12 |
| 5 | 2 | 12 (2.4) | 15 |
| 6 | 2 | 14 (2.33) | 18 |
| 7 | 3 | 17 (2.43) | 21 |
| 8 | 3 | 19 (2.38) | 24 |
| 9 | 3 | 21 (2.33) | 27 |
| 10 | 4 | 24 (2.4) | 30 |
| 11 | 4 | 26 (2.36) | 33 |
| 12 | 4 | 28 (2.33) | 36 |
| 13 | 5 | 31 (2.36) | 39 |

While the present invention has been disclosed in terms of the preferred embodiment in order to facilitate better understanding of the invention, it should be appreciated that the invention can be embodied in various ways without departing from the principle of the invention. Therefore, the invention should be understood to include all possible embodiments and modifications to the shown embodiments which can be embodied without departing from the principle of the invention set out in the appended claims.

What is claimed is:

1. A code processor for converting first coding system codes established according to one coding system, which codes represent at least mutually distinct first and second types of information in different first and second ranges of values, into second coding system codes established according to the other coding system, the minimum value of said second range of values being greater than the maximum value of said first range of values, said processor comprising:

memory means for storing said first coding system codes;
means for distinguishing each of said first coding system codes stored in said memory means between said first and second types of information and for generating an identification code to distinguish said first and second types of information;
means for deriving another first coding system codes having said first types of information in a third range of values corresponding to said first coding system codes in said first range of values and another first coding system codes having said second types of information in a fourth range of values corresponding to said first coding system codes in said second range of values, the minimum value of said third range of values being less than the maximum value of said fourth range of values;
means for converting said another first coding system codes in said third and fourth range of values and said identification code into said second system codes according to said second coding system; and
storing means for storing converted second coding system codes.

2. A code processor according to claim 1, in which said first coding system code is a hexadecimal code.

3. A code processor according to claim 2, in which said identification code generating means includes a comparator for comparing each value of said hexadecimal code with a predetermined value.

4. A code processor according to claim 3, in which said comparator produces a single binary bit.

5. A code processor according to claim 1, in which said means for deriving another first coding system codes includes a subtractor for subtracting a predetermined value from each value of said first coding system codes to obtain another first code system code which represents the information contained in said first coding system code stored in said memory means in combination with said identification code.

6. A code converting system for converting a plurality of given digits of binary code values into a corresponding sequence of decimal digits, comprising:

first means for storing said binary code values;
second means for reading out each of said binary code values from said first means and comparing a read out binary code value with a given value across which information contained in said binary code is separated into first and second type information and for generating for each binary code value an attribute bit identifying the type of the corresponding binary code value;
third means for converting each binary code value into another binary code value according to the value of said attribute bit corresponding to said each binary code value;
fourth means for converting each another binary code values in decimal digits so that the combination of said converted decimal digits and the corresponding attribute bit represents an original binary code value; and
fifth means for storing the converted attribute bit and said decimal digits.

7. A code converting system as set forth in claim 6, which further comprises sixth means for subtracting a predetermined value from said binary code value for distinguishing the binary code representative third type of information which is to be converted.

8. A code converting system as set forth in claim 6, which further comprises sixth means for concatenating said attribute bits for a given number of said binary code values, in said fifth means.

9. A code converting system as set forth in claim 8, which further comprises a seventh means for converting said concatenated attribute bits into a decimal attribute digit.

10. A code converting system as set forth in claim 9, which further comprises an eighth means for concatenating said attribute digit and the decimal digits of binary code values corresponding to said concatenated attribute bits.

11. A code converting system as set forth in claim 10, which further comprises a re-converting means for converting said decimal digits into said binary code values, which includes means for converting each of said attribute digit into individual attribute bits, each corresponding to a decimal digit, means for converting said decimal digits into binary values, means for adding said predetermined value, and means for re-converting said attribute bits into a binary value and means for combining said binary value derived from said decimal digits and said binary value derived from said attribute bit.

12. A code processor for converting values of a code in a first coding system, such as an 8-bit binary code which includes at least two mutually distinct types of information grouped in at least a first and a second range of values in said system to represent at least first and second types of information such as alphanumerical characters and Japanese katakana characters, into values in a second coding system such as decimal system, wherein the minimum value of said second range of values is greater than the maximum value of said first range of values, comprising:

memory means for storing the values of said code in said first coding system;

first subtractor means for subtracting a control code, if any, from said code in said first coding system when said code in said first coding system is read out from memory means;

means for discriminating said code in said first coding system when read out from said memory means to distinguish said first range of values representing for example alphanumeric characters from said second range of values representing for example said katakana characters and providing a discrimination signal representative of a distinction between said first and said second range of values;

second subtractor means responsive to said discrimination signal for subtracting a value for the output of said first subtractor means depending on whether said second range of values is discriminated by said discriminating means, thus to represent both of said first and said second range of values in said second coding system;

converting the output of said second subtractor and said discriminator into said second coding system having a third range of values for said first range of values in said first coding system and a fourth range of values for said second coding system, and providing a converted output representative thereon; and storing said converted output.

* * * * *